(12) United States Patent
Zhang et al.

(10) Patent No.: US 11,839,875 B2
(45) Date of Patent: Dec. 12, 2023

(54) DRIVING CIRCUIT, METHOD FOR DRIVING THE SAME, AND MICROFLUIDIC DEVICE

(71) Applicant: Shanghai Tianma Micro-Electronics Co., Ltd., Shanghai (CN)

(72) Inventors: Kaidi Zhang, Shanghai (CN); Boquan Lin, Shanghai (CN); Yunfei Bai, Shanghai (CN); Wei Li, Shanghai (CN); Shun Gong, Shanghai (CN); Linzhi Wang, Shanghai (CN); Kerui Xi, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 21 days.

(21) Appl. No.: 17/743,794

(22) Filed: May 13, 2022

(65) Prior Publication Data
US 2022/0314220 A1   Oct. 6, 2022

(30) Foreign Application Priority Data

Feb. 23, 2022   (CN) .......................... 202210167553.0

(51) Int. Cl.
*H03K 17/725*   (2006.01)
*B01L 3/00*   (2006.01)

(52) U.S. Cl.
CPC ..... *B01L 3/502715* (2013.01); *B01L 3/50273* (2013.01); *H03K 17/725* (2013.01); *B01L 2300/0645* (2013.01)

(58) Field of Classification Search
CPC ..................................................... H03K 17/725
USPC ......................................................... 327/108
See application file for complete search history.

(56) References Cited

U.S. PATENT DOCUMENTS

2018/0108298 A1*   4/2018   He .................... G09G 3/3233
2022/0044604 A1*   2/2022   Yin ................... G09G 3/3208

FOREIGN PATENT DOCUMENTS

CN   112885302 A   6/2021
CN   113674707 A   11/2021

* cited by examiner

*Primary Examiner* — Tomi Skibinski
(74) *Attorney, Agent, or Firm* — CHRISTENSEN O'CONNOR JOHNSON KINDNESS PLLC

(57) ABSTRACT

A driving circuit, a method for driving the same, and a microfluidic device are provided. The driving circuit includes a constant voltage writing module configured to transmit a constant voltage to an output terminal of the driving circuit, an AC voltage writing module configured to transmit an AC voltage to the output terminal of the driving circuit, a first switch, and a first capacitor. The first switch includes an input terminal electrically connected to a third signal line, an output terminal electrically connected to control terminals of the AC voltage writing module and the constant voltage writing module, and a control terminal electrically connected to a first scan line. The first capacitor is configured to stabilize a potential of the output terminal the first switch.

17 Claims, 8 Drawing Sheets

001 during a first stage, controlling, by a signal of the first scan line, the first switch to be turned on, transmitting, a first signal of the third signal line, to the control terminal of the constant voltage writing module and the control terminal of the AC voltage writing module, controlling, by the first signal, the constant voltage writing module to be turned on, and the AC voltage writing module to be turned off;, and transmitting a constant voltage by the first signal line to the output terminal of the driving circuit during a second stage, controlling, by the signal of the first scan line, the first switch to be turned on, transmitting, a second signal of the third signal line, to the control terminal of the constant voltage writing module and the control terminal of the AC voltage writing module, controlling by the second signal, the constant voltage writing module to be turned off, and the AC voltage writing module to be turned on, and, transmitting an AC voltage by the second signal line to the output terminal of the driving circuit

FIG. 7

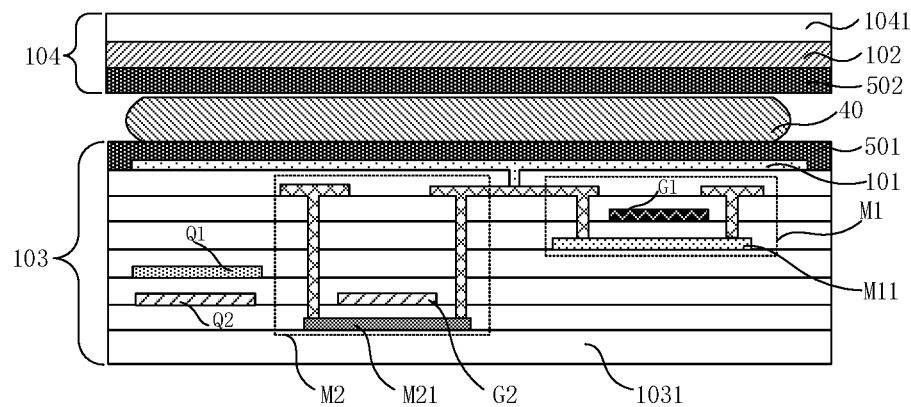

FIG. 8

DRIVING CIRCUIT, METHOD FOR DRIVING THE SAME, AND MICROFLUIDIC DEVICE

CROSS-REFERENCE TO RELATED APPLICATION

The present application claims priority to Chinese Patent Application No. 202210167553.0, filed on Feb. 23, 2022, the content of which is incorporated herein by reference in its entirety.

TECHNICAL FIELD

The present disclosure relates to the field of microfluidic technologies, and, particularly, relates to a driving circuit, a method for driving a driving circuit, and a microfluidic device.

BACKGROUND

In a microfluidic technology, micropipes (tens to hundreds of microns in size) are utilized to process or manipulate tiny fluid flows (with volumes ranging from nanoliters to liters). The microfluidic technology has characters of miniaturization and integration, and are widely applied in biology, chemistry, medical and other fields.

In a field of digital microfluidic technology based on electro-wetting, a microfluidic device usually drive tiny fluids to flow by setting a substrate voltage, and its driving manner includes a passive driving solution and an active driving solution.

In the passive driving solution, an alternating current (AC) signal is generally used to drive the tiny fluid to flow. Compared with a solution where the tiny fluid is driven by a direct current (DC) signal, the AC driving can improve driving capability, reduce hysteresis effect of the tiny fluid, and avoid charging accumulation in a dielectric layer.

However, in the active driving solution based on thin film transistors in the related art, due to the characteristics of the thin film transistors, stable and reliable AC signal driving cannot be achieved. Therefore, an active driving solution reaching stably and reliably driving by an AC signal can be provided.

SUMMARY

In a first aspect of the present disclosure, a driving circuit is provided. The driving circuit includes a constant voltage writing module, an alternating current (AC) voltage writing module, a first switch, and a first capacitor. The constant voltage writing module includes an input terminal electrically connected to a first signal line, an output terminal electrically connected to an output terminal of the driving circuit, and a control terminal. The constant voltage writing module is configured to transmit a constant voltage to the output terminal of the driving circuit. The AC voltage writing module includes an input terminal electrically connected to a second signal line, an output terminal electrically connected to the output terminal of the driving circuit, and a control terminal. The AC voltage writing module is configured to transmit an alternating current (AC) voltage to the output terminal of the driving circuit. The first switch includes an input terminal electrically connected to a third signal line, an output terminal electrically connected to the control terminal of the AC voltage writing module and the control terminal of the constant voltage writing module, and a control terminal electrically connected to a first scan line. The first capacitor includes one electrode plate electrically connected to the output terminal of the first switch, and another electrode plate electrically connected to a reference signal line.

In a second aspect of the present disclosure, a method for driving a driving circuit is provided. The driving circuit includes a constant voltage writing module, an alternating current (AC) voltage writing module, a first switch, and a first capacitor. The constant voltage writing module includes an input terminal electrically connected to a first signal line, an output terminal electrically connected to an output terminal of the driving circuit, and a control terminal. The constant voltage writing module is configured to transmit a constant voltage to the output terminal of the driving circuit. The AC voltage writing module includes an input terminal electrically connected to a second signal line, an output terminal electrically connected to the output terminal of the driving circuit, and a control terminal. The AC voltage writing module is configured to transmit an alternating current (AC) voltage to the output terminal of the driving circuit. The first switch includes an input terminal electrically connected to a third signal line, an output terminal electrically connected to the control terminal of the AC voltage writing module and the control terminal of the constant voltage writing module, and a control terminal electrically connected to a first scan line. The first capacitor includes one electrode plate electrically connected to the output terminal of the first switch, and another electrode plate electrically connected to a reference signal line. The method includes:

during a first stage, controlling, by a signal of the first scan line, the first switch to be turned on, transmitting a first signal of the third signal line to the control terminal of the constant voltage writing module and the control terminal of the AC voltage writing module, controlling, by the first signal, the constant voltage writing module to be turned on and the AC voltage writing module to be turned off, and transmitting a constant voltage by the first signal line to the output terminal of the driving circuit; and during a second stage, controlling, by the signal of the first scan line, the first switch to be turned on, transmitting a second signal of the third signal line to the control terminal of the constant voltage writing module and the control terminal of the AC voltage writing module, controlling by the second signal, the constant voltage writing module to be turned off and the AC voltage writing module to be turned on, and, transmitting an AC voltage by the second signal line to the output terminal of the driving circuit.

In a third aspect of the present disclosure, a microfluidic device is provided. The microfluidic device includes a driving circuit and a first electrode. The driving circuit includes a constant voltage writing module, an alternating current (AC) voltage writing module, a first switch, and a first capacitor. The constant voltage writing module includes an input terminal electrically connected to a first signal line, an output terminal electrically connected to an output terminal of the driving circuit, and a control terminal. The constant voltage writing module is configured to transmit a constant voltage to the output terminal of the driving circuit. The AC voltage writing module includes an input terminal electrically connected to a second signal line, an output terminal electrically connected to the output terminal of the driving circuit, and a control terminal. The AC voltage writing module is configured to transmit an alternating current (AC) voltage to the output terminal of the driving circuit. The first switch includes an input terminal electrically connected to a third signal line, an output terminal electrically connected to the control terminal of the AC voltage writing module and the control terminal of the constant voltage writing module, and a control terminal electrically connected to a first scan line. The first capacitor includes one electrode plate electrically connected to the output terminal of the first switch, and another electrode plate electrically connected to a reference signal line. The output terminal of the driving circuit is electrically connected to the first electrode.

BRIEF DESCRIPTION OF DRAWINGS

In order to more clearly illustrate technical solutions of embodiments of the present disclosure, the accompanying drawings used in the embodiments are briefly described below. The drawings described below are merely some of the embodiments of the present disclosure. Based on these drawings, those skilled in the art can obtain other drawings.

FIG. 7 is a flowchart of a method for driving a driving circuit according to an embodiment of the present disclosure;

FIG. 8 is a structural schematic diagram of a microfluidic device according to an embodiment of the present disclosure;

DESCRIPTION OF EMBODIMENTS

In order to better understand the technical solutions of the present disclosure, the embodiments of the present disclosure are described in detail below with reference to the accompanying drawings.

It should be clear that the described embodiments are only some of the embodiments of the present disclosure, but not all of the embodiments. Based on the embodiments in the present disclosure, all other embodiments obtained by those of ordinary skill in the art fall within the protection scope of the present disclosure.

The terms used in the embodiments of the present disclosure are only for the purpose of describing specific embodiments, and are not intended to limit the present disclosure. As used in the embodiments of this application and the appended claims, the singular forms "a," "the," and "the" are intended to include the plural forms as well, unless the context clearly dictates otherwise.

It should be understood that the term "and/or" used in this document is only an association relationship to describe the associated objects, indicating that there may be three relationships, for example, A and/or B, which may indicate that A alone, A and B, and B alone. The character "/" in this document generally indicates that the related objects are an "or" relationship.

In this specification, it should be understood that words such as "basically", "approximately", "about", "substantially" and "generally" described in the claims and embodiments of the present disclosure refer to a value within a reasonable technological operating ranges or tolerance ranges, which may be generally approved and is not a precise value.

It should be understood that although the terms 'first' and 'second' can be used in the present disclosure to describe transistors and electrodes, these transistors and electrodes should not be limited to these terms. These terms are used only to distinguish transistors and electrodes from each other. For example, without departing from the scope of the embodiments of the present disclosure, a first transistor can also be referred to as a second transistor. Similarly, the second transistor can also be referred to as the first transistor.

Figure 1:
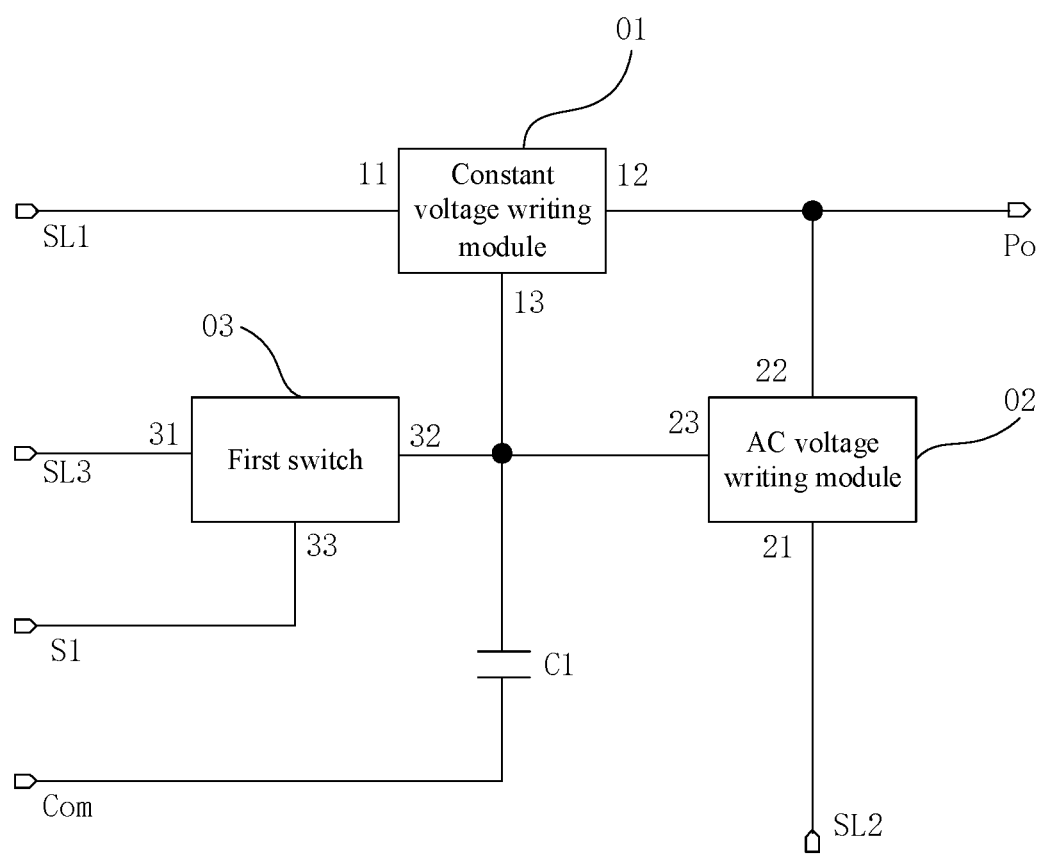
FIG. 1 is a schematic diagram of a driving circuit according to an embodiment of the present disclosure.
Figure 2:
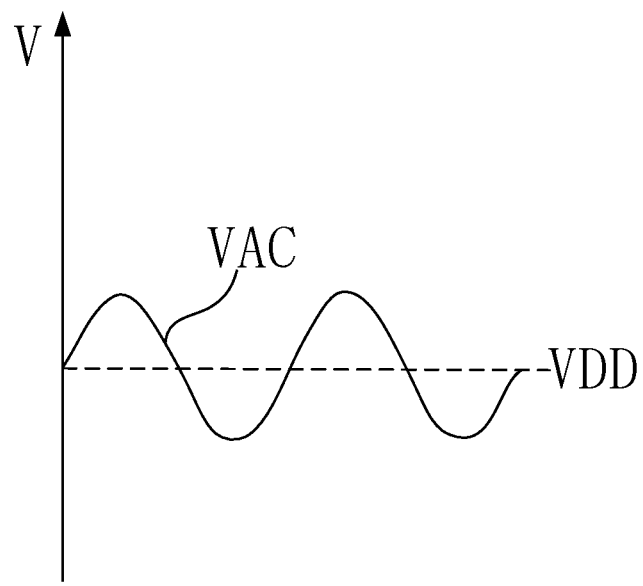
FIG. 2 is an AC voltage waveform diagram according to an embodiment of the present disclosure.
Figure 3:
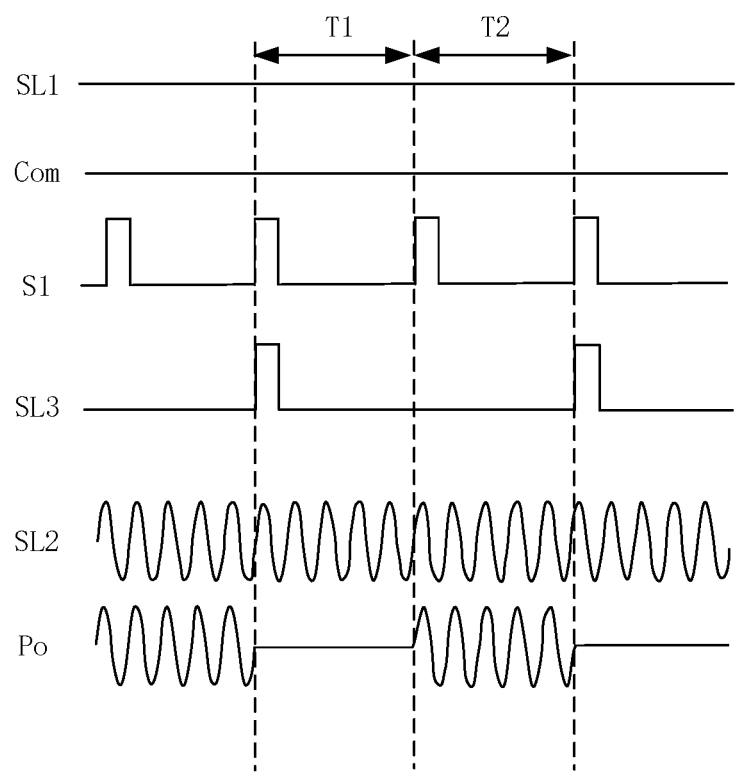
FIG. 3 is an operating timing sequence of the driving circuit shown in FIG. 1 according to an embodiment of the present disclosure.

FIG. 1 is a schematic diagram of a driving circuit according to an embodiment of the present disclosure, FIG. 2 is an AC voltage waveform diagram according to an embodiment of the present disclosure, and FIG. 3 is an operating timing sequence of the driving circuit shown in FIG. 1 according to an embodiment of the present disclosure.

In the present disclosure, a driving circuit 001 is provided. The driving circuit 001 includes a constant voltage writing module 01, an alternating current (AC) voltage writing module 02, a first switch 03, and a first capacitor C1.

An input terminal 11 of the constant voltage writing module 01 is electrically connected to a first signal line SL1. The first signal line SL1 transmits a constant voltage VDD. An output terminal 12 of the constant voltage writing module 01 is electrically connected to an output terminal Po of the driving circuit 001. The constant voltage writing module 01 is configured to transmit the constant voltage VDD to the output terminal Po of the driving circuit 001. That is, when the constant voltage writing module 01 is turned on, the constant voltage VDD of the first signal line SL1 is transmitted to the output terminal Po of the driving circuit 001.

In an embodiment, the constant voltage VDD is 0V.

An input terminal 21 of the AC voltage writing module 02 is electrically connected to a second signal line SL2. The second signal line SL2 transmits the AC voltage VAC. An output terminal 22 of the AC voltage writing module 02 is electrically connected to the output terminal Po of the driving circuit 001. The AC voltage writing module 02 is configured to transmit an AC voltage to the output terminal Po of the driving circuit 001. That is, when the AC voltage writing module 02 is turned on, an AC voltage VAC of the second signal line SL2 is transmitted to the output terminal Po of the driving circuit 001.

In an embodiment, as shown in FIG. 2, the AC voltage VAC has a waveform of a sine wave, and fluctuates up and down around the constant voltage VDD as the center.

In an embodiment, the constant voltage VDD can be an intermediate value between a high level and a low level of the AC voltage VAC.

The AC voltage VAC can also have a triangular or square waveform.

Since the output terminal 22 of the AC voltage writing module 02 and the output terminal 12 of the constant voltage writing module 01 are electrically connected to the output terminal Po of the driving circuit 001, the AC voltage writing module 02 and the constant voltage writing module 01 cannot be synchronously turned on.

An input terminal 31 of the first switch 03 is electrically connected to a third signal line SL3, an output terminal 32 of the first switch 03 is electrically connected to the control terminal 23 of the AC voltage writing module 02 and the control terminal 13 of the constant voltage writing module 01, and a control terminal 33 of the first switch 03 is electrically connected to the first scan line S1. That is, a signal of the first scan line S1 controls the on-off state of the first switch 03, and the first switch 03 is configured to transmit the signal of the third signal line SL3 to the control terminal 23 of the AC voltage writing module 02 and the control terminal 13 of the voltage writing module 01, thereby controlling an on-off state of the AC voltage writing module 02 and an on-off state of the constant voltage writing module 01.

One electrode plate of a first capacitor C1 is electrically connected to the output terminal 32 of the first switch 03, and another electrode plate of the first capacitor C1 is electrically connected to a reference signal line Com.

The reference signal line Com is configured to transmit a common signal connected to a constant potential. In an embodiment, the reference signal line Com is connected to a potential of 0V.

A principle for operating the driving circuit shown in FIG. 1 will be described below with reference to FIG. 1 and FIG. 3.

An operation process of the driving circuit 001 includes multiple first stages T1 and second stages T2 that are repeated. During the first stage T1, the first scan line S1 transmits an effective signal to control the first switch 03 to be turned on. At this time, the third signal line SL3 transmits a first signal to the control terminal 23 of the AC voltage writing module 02 and the control terminal 13 of the constant voltage writing module 01 through the first switch 03 turned on. The first signal controls the constant voltage writing module 01 to be turned on and controls the AC voltage writing module 02 to be turned off. At this time, a constant voltage VDD of the first signal line SL1 is transmitted to the output terminal Po of the driving circuit 001 through the constant voltage writing module 01 that is turned on, and then the constant voltage VDD is output by the driving circuit 001.

During the second stage T2, the first scan line S1 transmits an effective signal to control the first switch 03 to be turned on. At this time, the third signal line SL3 transmits a second signal to the control terminal 23 of the AC voltage writing module 02 and the control terminal 13 of the constant voltage writing module 01 through the first switch 03 that is turned on. The second signal controls the AC voltage writing module 02 to be turned on and controls the constant voltage writing module 01 to be turned off. At this time, the AC voltage VAC of the second signal line SL2 is transmitted to the output terminal Po of the driving circuit 001 through the AC voltage writing module 02 turned on, and the driving circuit 001 outputs a constant voltage VDD.

During the first stage T1, one electrode plate of the first capacitor C1 is charged when the first signal is transmitted to the output terminal 32 of the first switch 03. Since another electrode plate of the first capacitor C1 is connected to a reference signal line Com, the first capacitor C1 can maintain stability of the first signal, so that the constant voltage writing module 01 is stably turned on, thereby outputting a stable constant voltage VDD by the driving circuit 001.

During the second stage T2, one electrode plate of the first capacitor C1 is charged when the second signal is transmitted to the output terminal 32 of the first switch 03. Since another electrode plate of the first capacitor C1 is connected to the reference signal line Com, the first capacitor C1 can maintain stability of the second signal, so that the AC voltage writing module 02 is stably turned on, thereby outputting a stable AC voltage VAC by the driving circuit 001.

In an embodiment of the present disclosure, the driving circuit 001 can output a stable AC voltage VAC, thereby achieving AC driving, and achieving switching output between reliable AC voltage VAC and constant voltage VDD which do not interfere with each other. If the driving circuit 001 is applied to a microfluidic device, the AC driving of the active microfluidic device is achieved, so that it is beneficial to improve driving capability for micro-fluid, thereby enhancing the performance of the active microfluidic device.

Compared with the direct current (DC) driving, the AC driving can avoid the continuous accumulation and residual charge on the driving electrodes, and can reduce a risk of droplet sticking.

In an embodiment of the present disclosure, the first scan line S1 is configured to transmit a pulse signal, and/or the third signal line SL3 is configured to transmit a pulse signal. That is, at least one of the first scan line S1 or the third signal line SL3 can transmit a pulse signal.

After the third signal line SL3 transmits an effective signal to the output terminal 32 of the first switch 03, due to the setting of the first capacitor C1, the effective signal of the third signal line SL3 will be maintained for a certain period of time, thereby the constant voltage writing module 01 or the AC voltage writing module 02 cannot be affected to be turned on in order to output a stable AC voltage VAC or a constant voltage VDD by the driving circuit 001.

The embodiments provided by the present disclosure can reduce the power consumption of the driving circuit 001 and save energy.

Figure 4:
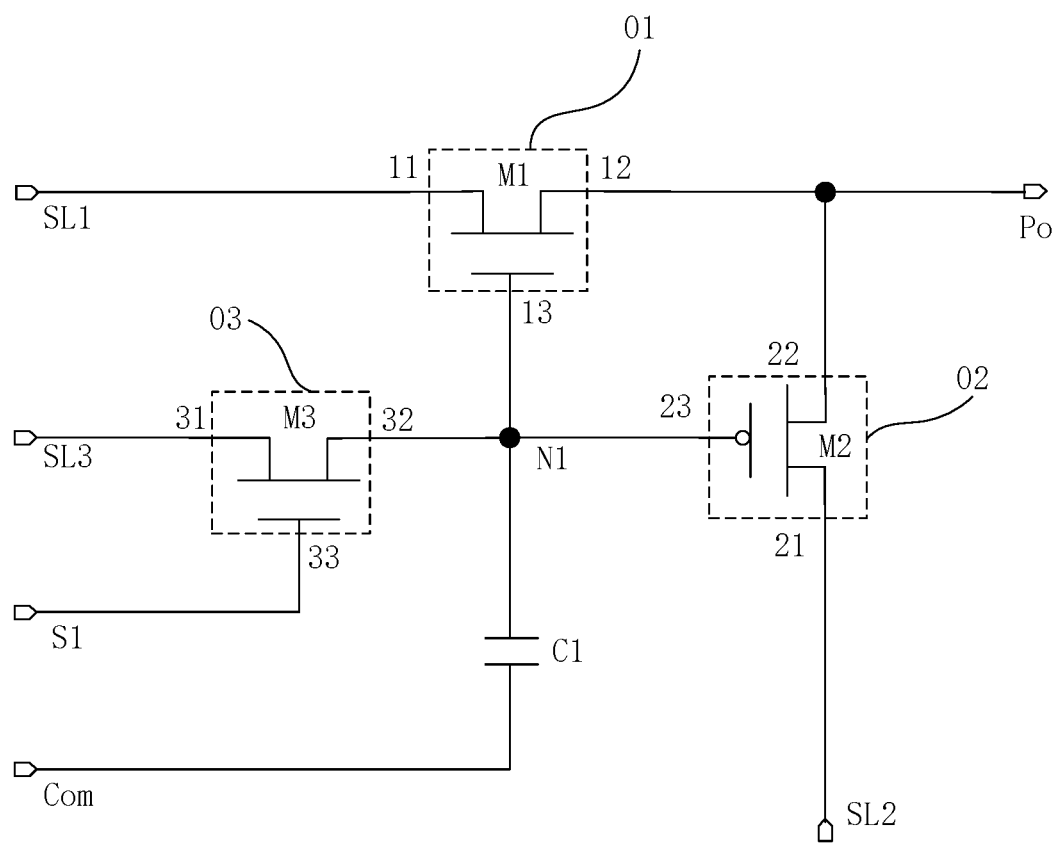
FIG. 4 is a schematic diagram of the driving circuit shown in FIG. 1 according to an embodiment of the present disclosure.

FIG. 4 is a schematic diagram of the driving circuit shown in FIG. 1 according to an embodiment of the present disclosure.

In an embodiment of the present disclosure, as shown in FIG. 4, the constant voltage writing module 01 includes a first transistor M1. A source of the first transistor M1 is electrically connected to the first signal line SL1, a drain of the first transistor M1 is electrically connected to the output terminal Po of the driving circuit 001, and a gate of the first transistor M1 is electrically connected to the output terminal 32 of the first switch 03. The first transistor M1 is configured to transmit a constant voltage VDD of the first signal line SL1 to the output terminal Po of the driving circuit 001.

In an embodiment, the first transistor M1 includes a metal oxide active layer.

The first transistor M1 can include an indium gallium zinc oxide (IGZO) active layer. Since the transistor including IGZO has a large on-off ratio (i.e., a ratio of a turn-on current to a turn-off current (leakage current)) and a small off-state leakage current, the first transistor M1 in the off state is beneficial to reduce the constant voltage VDD of the first signal line SL1 to enter the output terminal Po of the driving circuit 001, thereby reducing the influence of the constant voltage VDD on the AC voltage VAC output by the driving circuit 001, and increasing stability of the AC voltage VAC output by the driving circuit 001.

Referring to FIG. 4, the AC voltage writing module 02 includes a second transistor M2. A source of the second transistor M2 is electrically connected to the second signal line SL2, a drain of the second transistor M2 is electrically connected to the output terminal Po of the driving circuit 001, and a gate of the second transistor M2 is electrically connected to the gate of the first transistor M1. That is, the gate of the second transistor M2 is electrically connected to the output terminal 32 of the first switch 03. The second transistor M2 is configured to transmit the AC voltage VAC of the second signal line SL2 to the output terminal Po of the driving circuit 001.

The second transistor M2 and the first transistor M1 have different channel types.

That is, a same signal of the first switch 03 controls the on-off state of the second transistor M2 and the on-off state of the first transistor M1 to be different.

In an embodiment, the second transistor M2 is a P-type transistor, and the first transistor M1 is an N-type transistor.

In an embodiment, the second transistor M2 includes a polysilicon active layer.

The P-type transistor including the polysilicon active layer has advantages of high mobility and large on-state current. When the second transistor T2 is turned on, the output terminal Po of the driving circuit 001 can quickly respond to the AC voltage VAC to output without distortion, thereby improving stability and speed of the AC voltage VAC output by the driving circuit 001.

The AC voltage VAC can have a frequency in a wide range of 0.1 KHZ to 100 KHZ.

Referring to FIG. 4, in an embodiment of the present disclosure, the first switch 03 includes a third transistor M3. A source of the third transistor M3 is electrically connected to the third signal line SL3, a drain of the third transistor M3 is electrically connected to the control terminal 23 of the voltage writing module 02 and the control terminal 13 of the constant voltage writing module 01, and a gate of the third transistor M3 is electrically connected to the first scan line S1. The third transistor M3 is configured to transmit a signal of the third signal line SL3 to the control terminal 23 of the AC voltage writing module 02 and the control terminal 13 of the constant voltage writing module 01, thereby controlling the on-off state of the AC voltage writing module 02 and the on-off state of the constant voltage writing module 01.

In an embodiment, the third transistor M3 includes a metal oxide active layer.

The third transistor M3 can include an indium gallium zinc oxide (IGZO) active layer. Since the transistor including IGZO has a large on-off ratio and a small off-state leakage current, the third transistor M1 in the off state is beneficial to maintain stability of the N1 node potential, thereby improving stability of the on-off states of the second transistor T2 and the first transistor T1, and further improving stability of the signal output by the driving circuit 001.

A process for operating the driving circuit shown in FIG. 4 will be described in detail below with reference to FIG. 3 and FIG. 4.

In the following description, both the first transistor M1 and the third transistor M3 are N-type transistors, and the second transistor M2 is a P-type transistor.

During the first stage T1, the first scan line S1 transmits a turn-on signal, i.e., a high level signal, and the third transistor M3 is turned on; synchronously, the third signal line SL3 transmits a high level signal, i.e., a first signal. The first signal is transmitted to the gate of the first transistor M1 and the gate of the second M2 through the third transistor M3 turned on. The first signal controls the first transistor M1 to be turned on and controls the second transistor M2 to be turned off. At this time, the constant voltage VDD of the first signal line SL1 is transmitted to the output terminal Po of the driving circuit 001 through the first transistor M1 that is turned on and then the constant voltage VDD is output by the driving circuit 001.

Due to a potential maintaining effect of the first capacitor C1, the first signal of the third signal line SL3 can be maintained during the first stage T1, so that the driving circuit 001 can stably output a constant voltage VDD during the first stage T1. It is appreciated that, the third signal line SL3 can also continuously output the first signal during the first stage T1.

During a second stage T2, the first scan line S1 transmits a turn-on signal, that is, a high level signal, and the third transistor M3 is turned on; synchronously, the third signal line SL3 transmits a low level signal, that is, a second signal, the second signal is transmitted to the gate of the first transistor M1 and the gate of the second transistor M2 through the third transistor M3 turned on. The second signal controls the second transistor M2 to be turned on and controls the first transistor M1 to be turned off. At this time, the AC voltage VAC of the second signal line SL2 is transmitted to the output terminal Po of the driving circuit 001 through the second transistor M2 turned on and then the AC voltage VAC is output by the driving circuit 001.

Due to the potential maintaining effect of the first capacitor C1, the second signal of the third signal line SL3 can be maintained during a second stage T1, so that the driving circuit 001 can stably output an AC voltage VAC during the second stage T2. It is appreciated that, the third signal line SL3 can also continuously output the second signal during a second stage T2.

Figure 5:
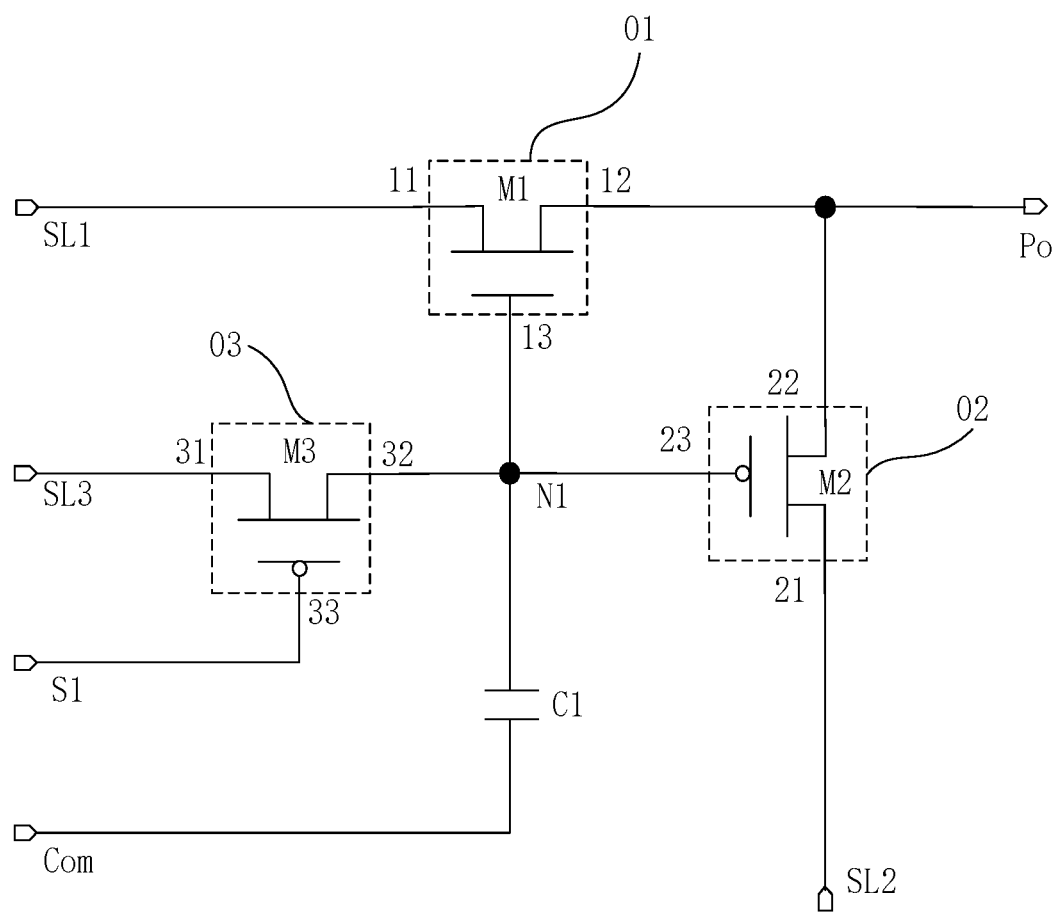
FIG. 5 is a schematic diagram of the driving circuit shown in FIG. 1 according to another embodiment of the present disclosure.
Figure 6:
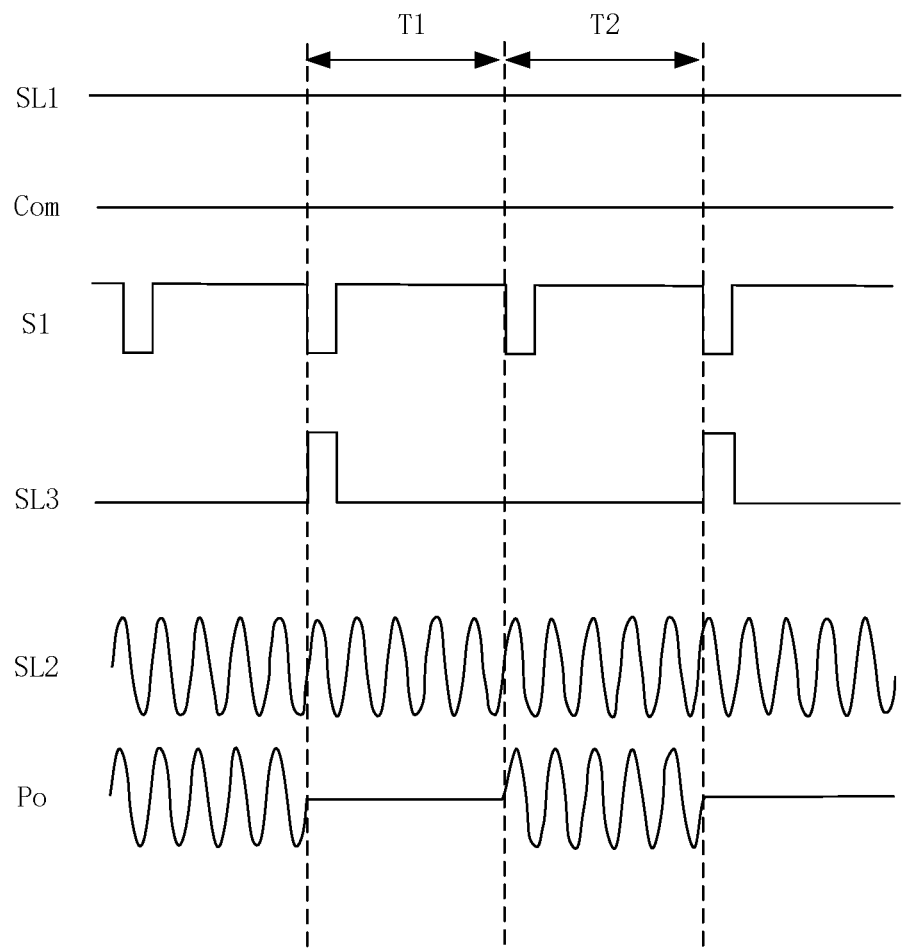
FIG. 6 is an operating timing sequence of the driving circuit shown in FIG. 5 according to an embodiment of the present disclosure.

FIG. 5 is a schematic diagram of the driving circuit shown in FIG. 1 according to another embodiment of the present disclosure, and FIG. 6 is an operating timing sequence of the driving circuit shown in FIG. 5 according to an embodiment of the present disclosure.

The driving circuit 001 shown in FIG. 5 differs from the driving circuit 001 shown in FIG. 4 only in that the third transistor M3 is a P-type transistor. Compared with the timing sequence shown in FIG. 3, the timing sequence changes corresponding to the driving circuit shown in FIG. 6 are as follows.

During the first stage T1 and the second stage T2, the first scan line S1 transmits a low level signal.

In the driving circuits shown in FIG. 4 and FIG. 5, at least one of the first transistor M1 or the third transistor M3 can further include a polysilicon active layer.

In the driving circuit 001, the signal of the first signal line SL1 can be configured to transmit a constant potential. That is, during the operation process of the driving circuit 001, the constant voltage VDD of the first signal line SL1 is a constant potential.

In an embodiment, during the operation process of the driving circuit 001, the constant voltage VDD has a potential of 0V.

In an embodiment of the present disclosure, a method for driving a driving circuit 001 provided in the above embodiments is provided. The structure of the driving circuit 001 can be referred to FIG. 1, FIG. 4 and FIG. 5, and the method can be understood in combination with the operating principle of the driving circuit 001 in the above embodiments.

The driving circuit 001 includes a constant voltage writing module 01, an AC voltage writing module 02, a first switch 03, and a first capacitor C1.

An input terminal 11 of the constant voltage writing module 01 is electrically connected to a first signal line SL1. The first signal line SL1 transmits a constant voltage VDD. An output terminal 12 of the constant voltage writing module 01 is electrically connected to an output terminal Po of the driving circuit 001. The constant voltage writing module 01 is configured to transmit the constant voltage VDD to the output terminal Po of the driving circuit 001. That is, when the constant voltage writing module 01 is turned on, the constant voltage VDD of the first signal line SL1 is transmitted to the output terminal Po of the driving circuit 001.

An input terminal 21 of the AC voltage writing module 02 is electrically connected to a second signal line SL2. The second signal line SL2 transmits the AC voltage VAC. An output terminal 22 of the AC voltage writing module 02 is electrically connected to the output terminal Po of the driving circuit 001. The AC voltage writing module 02 is configured to transmit an AC voltage to the output terminal Po of the driving circuit 001. That is, when the AC voltage writing module 02 is turned on, an AC voltage VAC of the second signal line SL2 is transmitted to the output terminal Po of the driving circuit 001.

An input terminal 31 of the first switch 03 is electrically connected to a third signal line SL3, an output terminal 32 of the first switch 03 is electrically connected to the control terminal 23 of the AC voltage writing module 02 and the control terminal 13 of the constant voltage writing module 01, and a control terminal 33 of the first switch 03 is electrically connected to the first scan line S1. That is, a signal of the first scan line S1 controls the on-off state of the first switch 03, and the first switch 03 is configured to transmit the signal of the third signal line SL3 to the control terminal 23 of the AC voltage writing module 02 and the control terminal 13 of the voltage writing module 01, thereby controlling the on-off states of the AC voltage writing module 02 and the constant voltage writing module 01.

One electrode plate of a first capacitor C1 is electrically connected to the output terminal 32 of the first switch 03, and another electrode plate of the first capacitor C1 is electrically connected to a reference signal line Com.

FIG. 7 is a flowchart of a method for driving a driving circuit according to an embodiment of the present disclosure.

As shown in FIG. 7, the method for driving the driving circuit includes steps S1 and S2.

At Step S1, during a first stage T1, a signal of the first scan line S1 controls the first switch 03 to be turned on, and the first signal of the third signal line SL3 is transmitted to the control terminal 13 of the constant voltage writing module 01 and the control terminal 23 of the AC voltage writing module 02, and the constant voltage writing module 01 is controlled to be turned on by the first signal, and the AC voltage writing module 02 is controlled to be turned off by the first signal; and synchronously, the first signal line SL1 transmits a constant voltage VDD to the output terminal Po of the driving circuit 001.

At Step S2, during a second stage T2, a signal of the first scan line S1 controls the first switch 03 to be turned on, a second signal of the third signal line SL3 is transmitted to the control terminal 13 of the constant voltage writing module 01 and the control terminal 23 of the AC voltage writing module 02, and the constant voltage writing module 01 is controlled to be turned off by the second signal and the AC voltage writing module 02 is controlled to be turned on by the second signal; and synchronously, the second signal line SL2 transmits the AC voltage VAC to the output terminal Po of the driving circuit 001.

Step S1 and step S2 can be performed alternately.

At step S1, during the first stage T1, when the first signal is transmitted to the control terminal 13 of the constant voltage writing module 01 and the control terminal 23 of the AC voltage writing module 02, the first capacitor C1 is charged. The first capacitor C1 maintains stability of the first signal, so that the constant voltage writing module 01 is turned on stably, thereby outputting a stable constant voltage VDD by the driving circuit 001.

At step S2, during the second stage T2, when the second signal is transmitted to the control terminal 13 of the constant voltage writing module 01 and the control terminal 23 of the AC voltage writing module 02, the first capacitor C1 is charged. The first capacitor C1 maintains stability of the second signal, so that the AC voltage writing module 01 is turned on stably, thereby outputting a stable AC voltage VAC by the driving circuit 001.

The method for driving the driving circuit provided by the present disclosure can ensure that the driving circuit 001 outputs a stable AC voltage VAC, and can achieve switching output between reliable AC voltage VAC and constant voltage VDD which do not interfere with each other. If the method for driving the driving circuit is applied to a microfluidic device, the AC driving of the active microfluidic device is achieved, so that the driving capability for microfluid is improved, thereby enhancing the performance of the active microfluidic device.

It can be understood that the AC voltage VAC or the constant voltage VDD output by the driving circuit 001 is transmitted to the driving electrodes electrically connected to the driving circuit 001. When the micro-fluid is driven by the method provided in the present disclosure, the driving circuit 001 perform a switch between the first stage T1 and the second stage T2 according to a moving path of the micro-fluid.

In some embodiments, when the micro-fluid moves from the position corresponding to one driving electrode A to the position corresponding to the adjacent driving electrode B, the driving circuit 001 electrically connected to the driving electrode B outputs the AC voltage VAC, that is, the second stage T2 is executed. The driving circuit 001 electrically connected to the driving electrodes A and other positions outputs a constant voltage VDD, that is, the first stage T1 is executed. The electric field generated by the driving electrode B drives the micro-fluid to move from the corresponding position of the driving electrode A to the corresponding position of the adjacent driving electrode B. FIG. 8 is a structural schematic diagram of a microfluidic device according to an embodiment of the present disclosure.

In an embodiment of the present disclosure, a microfluidic device 100 is provided. As shown in FIG. 8, the microfluidic device 100 includes the driving circuit 001 provided in the above embodiments and a first electrode 101, and the output terminal Po of the driving circuit 001 is electrically connected to the first electrode 101. That is, in the microfluidic device 100, the signal output by the driving circuit 001 is transmitted to the first electrode 101.

FIG. 8 only illustrates part of the structure of the driving circuit 001, such as the first transistor M1, the second transistor M2, and the first capacitor C1.

As shown in FIG. 8, in an embodiment of the present disclosure, the first transistor M1 includes a metal oxide active layer M11, the second transistor M2 includes a polysilicon active layer M21, and a first electrode plate Q1 of the first capacitor C1 is located between the metal oxide active layer M11 and the polysilicon active layer M21.

That is, the first electrode plate Q1 of the first capacitor C1 is located between the active layer of the first transistor M1 and the active layer of the second transistor M2.

In an embodiment, the metal oxide active layer M11 of the first transistor M1 can be located at a side of the polysilicon active layer M21 of the second transistor M2 facing towards the first electrode 101.

In an embodiment, the gate G2 of the second transistor M2 is located at a side of the polysilicon active layer M21 facing towards the first electrode plate Q1 of the first capacitor C1, and the gate G1 of the first transistor M1 is located at a side of the metal oxide active layer M11 facing away from the first electrode plate Q1 of the first capacitor C1.

The metal oxide active layer M11 of the first transistor M1 can also be located at a side of the polysilicon active layer M21 of the second transistor M2 facing away from the first electrode 101, which is not limited in the present disclosure.

Figure 9:
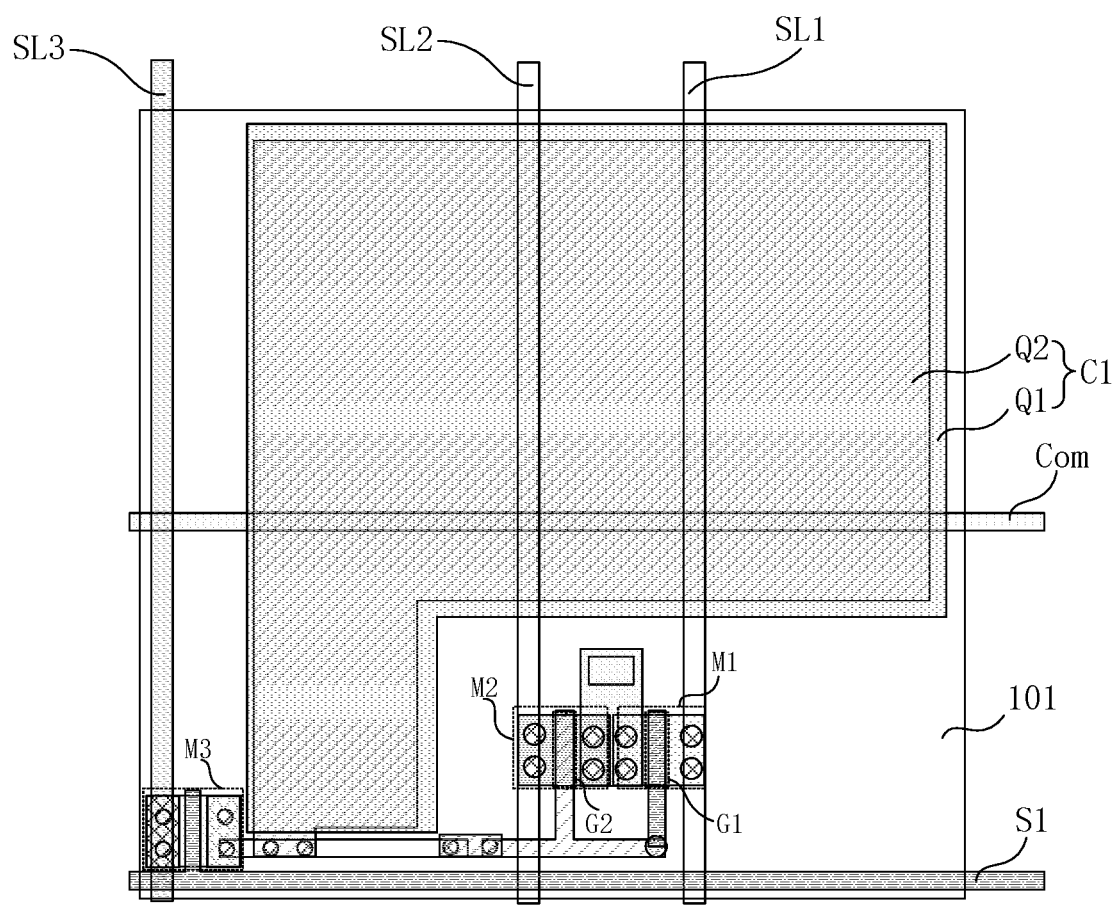
FIG. 9 is a schematic diagram of a layout of a driving circuit according to an embodiment of the present disclosure.

FIG. 9 is a schematic diagram of a layout of a driving circuit according to an embodiment of the present disclosure.

Referring to FIG. 8 and FIG. 9, in an embodiment of the present disclosure, the first capacitor C1 includes a second electrode plate Q2 which is formed in a same layer as the gate G2 of the second transistor M2.

In an embodiment, as shown in FIG. 9, a first electrode plate Q1 of the first capacitor C1 is electrically connected to a reference signal line Com, and a second electrode plate Q2 of the first capacitor C1 is connected to a gate G1 of the first transistor M1 and a gate G2 of the second transistor M2.

It is appreciated that, the first electrode plate Q1 of the first capacitor C1 can also be electrically connected to the gate G1 of the first transistor M1 and the gate G2 of the second transistor M2, and the second electrode plate Q2 of the first capacitor C1 can be electrically connected to the reference signal line Com.

In an embodiment of the present disclosure, since one electrode plate of the first capacitor C1 is electrically connected to the gate G1 of the first transistor M1 and the gate G2 of the second transistor M2, the other plate of the first capacitor C1 is electrically connected to the reference signal line Com of the voltage signal transmitted stably, the first capacitor C1 can stabilize the potential of the gate G1 of the first transistor M1 and the potential of the gate G2 of the second transistor M2. During the operation process of the driving circuit 001, stability of the on-off states of the first transistor T1 and the second transistor T2 is ensured, so that the driving circuit 001 outputs a stable constant voltage VDD or AC voltage VAC.

In an embodiment of the present disclosure, referring to FIG. 9, the first signal line SL1, the second signal line SL2, and the third signal line SL3 are arranged along a first direction X. The first signal line SL1, the second signal line SL2, and the third signal line SL3 each extend in a second direction Y. The first scan line S1 and the reference signal line Com are arranged along the second direction Y. The first scan line S1 and the reference signal line Com each extend along the first direction X.

The first transistor M1 and the second transistor M2 are arranged along the first direction X and are located at a same side of the output terminal of the third transistor M3.

The embodiments provided by the present disclosure can reduce the bending degree of the semiconductor layer and simplify preparations of the device.

Referring to FIG. 9, in an embodiment of the present disclosure, the first electrode 101 at least covers a part of the first signal line SL1, a part of the second signal line SL2, and a part of the third signal line SL3. On the one hand, the present disclosure can shield the signal received by the first electrode 101 from interfering effects of the signals of the first signal line SL1, the second signal line SL2, and the third signal line SL3, thereby avoiding the influence on driving micro-fluid to move. On the other hand, in the present disclosure, multiple first electrodes 101 in the microfluidic device 100 can be closely arranged, so that the electric field range generated by each first electrode 101 can be improved, thereby driving micro-fluid to move.

The capacitor C1 can be arranged between any two metal layers. That is, a capacitor C1 can be formed between any two metal layers of the layers of the driving circuit 001. In an embodiment, as shown in FIG. 8 and FIG. 9, the first electrode plate Q1 of the capacitor C1 is arranged between the gate G1 of the first transistor M1 and the gate G2 of the second transistor M2. The second electrode plate Q2 of the capacitor C1 is provided in a same layer as the gate G2 of the second transistor M2.

The thickness and materials of the first electrode plate Q1 and the second electrode plate Q2 does not affect the performance of the transistor, and can be flexibly designed to obtain a desired capacitance value.

In an embodiment of the present disclosure, referring to FIG. 8, the microfluidic device 100 further includes a second electrode 102. The second electrode 102 is insulated from the first electrode 101 and configured to receive a constant potential signal.

In an embodiment, the potential of the second electrode 102 is 0V.

In the microfluidic device 100, the second electrode 102 can be provided in a form of an entire surface.

The second electrode 102 can be located at a side of the first electrode 101 facing away from the driving circuit 001. That is, the second electrode 102 can be provided opposite to the first electrode 101.

The microfluidic device 100 can include a first substrate 103 and a second substrate 104 that are opposite to each other. The first substrate 103 includes a first substrate 1031. The first electrode 101 and the driving circuit 001 are provided on the first substrate 103. The first electrode 101 is located at a side of the driving circuit 001 facing away from the first substrate 1031. The second substrate 104 includes a second substrate 1041. The second electrode 102 is provided on the second substrate 104 and is located at a side of the second substrate 1041 facing towards the first substrate 103.

A microchannel can be provided between the first substrate 103 and the second substrate 104. The microchannel includes droplets 40. A first hydrophobic layer 501 is provided at a side of the droplet 40 facing towards the first substrate 103. A second hydrophobic layer 502 is provided at a side of the droplet 40 facing towards the second substrate 104. That is, the first substrate 103 can further include the first hydrophobic layer 501. The second substrate 104 can include the second hydrophobic layer 502. The material of the first hydrophobic layer 501 can be the same as the material of the second hydrophobic layer 502.

When the microfluidic device 100 is used, the driving circuit 001 provides a driving voltage for the first electrode 101, and the second electrode 102 is connected to a constant potential signal, an electric field is formed between the first electrode 101 and the second electrode 102, so that the droplet 40 is moved under driving of an electric field.

In an embodiment of the present disclosure, the signal output by the output terminal Po of the driving circuit 001 can be switched between the constant voltage VDD and the AC voltage VAC. When the driving circuit 001 outputs the AC voltage VAC, the droplet 40 is driven to move. When the driving circuit 001 outputs the constant voltage VDD, it has no driving capability.

Figure 10:
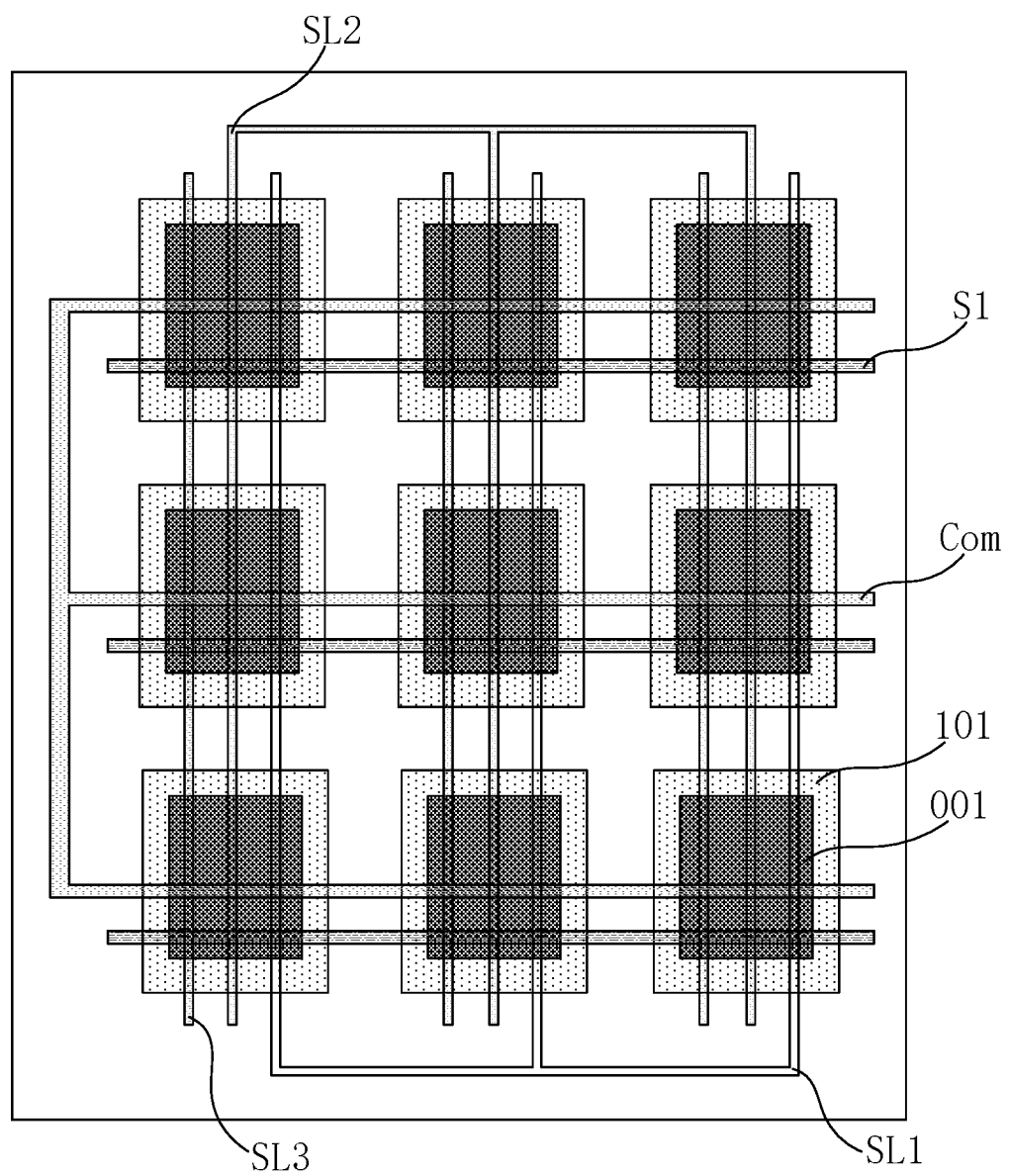
FIG. 10 is a plan view of a microfluidic device according to an embodiment of the present disclosure.

FIG. 10 is a plan view of a microfluidic device according to an embodiment of the present disclosure.

As shown in FIG. 10, the microfluidic device 100 includes multiple driving circuits 001 that can be arranged in an array. One driving circuit 001 is electrically connected to at least one first electrode 101. FIG. 10 only schematically illustrates a case where one driving circuit 001 is connected to one first electrode 101.

In the microfluidic device 100, the driving circuits 001 arranged in a row direction can share a same first scan line S1, and the driving circuits 001 arranged in a column direction can share a same third signal line SL3. The first signal line SL1, the second signal line SL2, and a reference signal line Com can be shared by all the driving circuits 001.

In the microfluidic device 100, the driving circuit 001 can output a stable AC voltage VAC, thereby achieving AC driving, and achieving switching output between reliable AC voltage VAC and constant voltage VDD which do not interfere with each other. In this way, the driving capability for micro-fluid is improved, and a risk of breakdown and hysteresis residual of the micro-fluid is reduced, and the performance of the active microfluidic device 100 is enhanced.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A driving circuit, comprising:
a constant voltage writing module, wherein the constant voltage writing module comprises an input terminal electrically connected to a first signal line, an output terminal electrically connected to an output terminal of the driving circuit, and a control terminal; and the constant voltage writing module is configured to transmit a constant voltage to the output terminal of the driving circuit;
an alternating current (AC) voltage writing module, wherein the AC voltage writing module comprises an input terminal electrically connected to a second signal line, an output terminal electrically connected to the output terminal of the driving circuit, and a control terminal; and the AC voltage writing module is configured to transmit an alternating current (AC) voltage to the output terminal of the driving circuit;
a first switch, wherein the first switch comprises an input terminal electrically connected to a third signal line, an output terminal electrically connected to the control terminal of the AC voltage writing module and the control terminal of the constant voltage writing module, and a control terminal electrically connected to a first scan line; and
a first capacitor, wherein the first capacitor comprises one electrode plate electrically connected to the output terminal of the first switch, and another electrode plate electrically connected to a reference signal line.

2. The driving circuit according to claim 1, wherein at least one of the first scan line or the third signal line is configured to transmit a pulse signal.

3. The driving circuit according to claim 1, wherein the constant voltage writing module comprises a first transistor, wherein the first transistor comprises a source electrically connected to the first signal line, a drain electrically connected to the output terminal of the driving circuit, and a gate electrically connected to the output terminal of the first switch.

4. The driving circuit according to claim 3, wherein the first transistor comprises a metal oxide active layer.

5. The driving circuit according to claim 3, wherein the AC voltage writing module comprises a second transistor, wherein the second transistor comprises a source electrically connected to the second signal line, a drain electrically connected to the output terminal of the driving circuit, and a gate electrically connected to the gate of the first transistor; and
the second transistor and the first transistor have different channel types.

6. The driving circuit according to claim 5, wherein the second transistor comprises a polysilicon active layer.

7. The driving circuit according to claim 3, wherein the first switch comprises a third transistor, wherein the third transistor comprises a source electrically connected to the third signal line, a drain electrically connected to the control terminal of the AC voltage writing module, and a gate electrically connected to the first scan line.

8. The driving circuit according to claim 7, wherein the third transistor comprises a metal oxide active layer.

9. The driving circuit according to claim 1, wherein the first signal line is configured to transmit a constant potential.

10. A method for driving a driving circuit, wherein the driving circuit comprises:
a constant voltage writing module, wherein the constant voltage writing module comprises an input terminal electrically connected to a first signal line, an output terminal electrically connected to an output terminal of the driving circuit, and a control terminal; and the constant voltage writing module is configured to transmit a constant voltage to the output terminal of the driving circuit;
an alternating current (AC) voltage writing module, wherein the AC voltage writing module comprises an input terminal electrically connected to a second signal line, an output terminal electrically connected to the output terminal of the driving circuit, and a control terminal; and the AC voltage writing module is configured to transmit an alternating current (AC) voltage to the output terminal of the driving circuit;
a first switch, wherein the first switch comprises an input terminal electrically connected to a third signal line, an output terminal electrically connected to the control terminal of the AC voltage writing module and the control terminal of the constant voltage writing module, and a control terminal electrically connected to a first scan line; and
a first capacitor, wherein the first capacitor comprises one electrode plate electrically connected to the output terminal of the first switch, and another electrode plate electrically connected to a reference signal line; and
wherein the method comprises:
during a first stage, controlling, by a signal of the first scan line, the first switch to be turned on, transmitting a first signal of the third signal line to the control terminal of the constant voltage writing module and the control terminal of the AC voltage writing module, controlling, by the first signal, the constant voltage writing module to be turned on and the AC voltage writing module to be turned off, and transmitting a constant voltage by the first signal line to the output terminal of the driving circuit; and during a second stage, controlling, by the signal of the first scan line, the first switch to be turned on, transmitting a second signal of the third signal line to the control terminal of the constant voltage writing module and the control terminal of the AC voltage writing module, controlling by the second signal, the constant voltage writing module to be turned off and the AC voltage writing module to be turned on, and, transmitting an AC voltage by the second signal line to the output terminal of the driving circuit.

11. The method according to claim 10, wherein during the first stage, the first capacitor is charged when the first signal is transmitted to the control terminal of the constant voltage writing module and the control terminal of the AC voltage writing module, wherein the first capacitor maintains stability of the first signal; and during the second stage, the first capacitor is charged when the second signal is transmitted to the control terminal of the constant voltage writing module and the control terminal of the AC voltage writing module, wherein the first capacitor maintains stability of the second signal.

12. A microfluidic device, comprising:
a driving circuit; and
a first electrode,
wherein the driving circuit comprises:
a constant voltage writing module, wherein the constant voltage writing module comprises an input terminal electrically connected to a first signal line, an output terminal electrically connected to an output terminal of the driving circuit, and a control terminal; and the constant voltage writing module is configured to transmit a constant voltage to the output terminal of the driving circuit;
an alternating current (AC) voltage writing module, wherein the AC voltage writing module comprises an input terminal electrically connected to a second signal line, an output terminal electrically connected to the output terminal of the driving circuit, and a control terminal; and the AC voltage writing module is configured to transmit an alternating current (AC) voltage to the output terminal of the driving circuit;
a first switch, wherein the first switch comprises an input terminal electrically connected to a third signal line, an output terminal electrically connected to the control terminal of the AC voltage writing module and the control terminal of the constant voltage writing module, and a control terminal electrically connected to a first scan line; and
a first capacitor, wherein the first capacitor comprises one electrode plate electrically connected to the output terminal of the first switch, and another electrode plate electrically connected to a reference signal line; and
wherein the output terminal of the driving circuit is electrically connected to the first electrode.

13. The microfluidic device according to claim 12, wherein the constant voltage writing module comprises a first transistor, wherein the first transistor comprises a source electrically connected to the first signal line, a drain electrically connected to the output terminal of the driving circuit, and a gate electrically connected to the output terminal of the first switch;

the AC voltage writing module comprises a second transistor, wherein the second transistor comprises a source electrically connected to the second signal line, a drain electrically connected to the output terminal of the driving circuit, and a gate electrically connected to the gate of the first transistor;

the first transistor comprises a metal oxide active layer, the second transistor comprises a polysilicon active layer; and a first electrode plate is the another electrode plate electrically connected to the reference signal line and is located between the metal oxide active layer and the polysilicon active layer.

14. The microfluidic device according to claim 13, wherein the gate of the second transistor is located at a side of the polysilicon active layer facing towards the first electrode plate of the first capacitor, and the gate of the first transistor is located at a side of the metal oxide active layer facing away from the first electrode plate of the first capacitor.

15. The microfluidic device according to claim 14, wherein a second electrode plate is the one electrode plate electrically connected to the output terminal of the first switch and formed in a same layer as the gate of the second transistor.

16. The microfluidic device according to claim 12, further comprising:
a second electrode, wherein the second electrode is insulated from the first electrode and configured to receive a constant potential signal.

17. The microfluidic device according to claim 16, wherein the second electrode is located at a side of the first electrode facing away from the driving circuit.

* * * * *